United States Patent
Katsumata et al.

(10) Patent No.: US 11,378,604 B2
(45) Date of Patent: Jul. 5, 2022

(54) METHOD AND DEVICE FOR DETECTING POSITIONAL CHANGE AMOUNT DUE TO MOVEMENT OF MOVING BODY

(71) Applicant: SANKYO SEISAKUSHO CO., Tokyo (JP)

(72) Inventors: Kazuhisa Katsumata, Kikugawa (JP); Naoyuki Takahashi, Kikugawa (JP)

(73) Assignee: SANKYO SEISAKUSHO CO., Tokyo (JP)

( * ) Notice: Subject to any disclaimer, the term of this patent is extended or adjusted under 35 U.S.C. 154(b) by 0 days.

(21) Appl. No.: 16/966,679

(22) PCT Filed: Feb. 1, 2019

(86) PCT No.: PCT/JP2019/003623
§ 371 (c)(1),
(2) Date: Jul. 31, 2020

(87) PCT Pub. No.: WO2019/151479
PCT Pub. Date: Aug. 8, 2019

(65) Prior Publication Data
US 2021/0033653 A1 Feb. 4, 2021

(30) Foreign Application Priority Data
Feb. 2, 2018 (JP) .............................. JP2018-017543

(51) Int. Cl.
*G01R 23/16* (2006.01)
(52) U.S. Cl.
CPC ................... *G01R 23/16* (2013.01)
(58) Field of Classification Search
CPC ............... G01R 23/16–20; G01D 2205/10–95
See application file for complete search history.

(56) References Cited

U.S. PATENT DOCUMENTS 4,687,330 A * 8/1987 Lefevre ............... G01C 19/726
356/464
5,455,498 A * 10/1995 Kakimoto ............ G01D 5/243
318/605
(Continued)

FOREIGN PATENT DOCUMENTS

DE    10041089 A1 *  3/2002  ............. G01D 5/145
DE    10163504 A1 *  7/2003  ........... G01D 5/2449
(Continued)

OTHER PUBLICATIONS

International Search Report (in English and Japanese) and Written Opinion of the International Searching Authority (in Japanese) issued in PCT/JP2019/003623, dated Apr. 9, 2019; ISA/JP.
(Continued)

*Primary Examiner* — Patrick Assouad
*Assistant Examiner* — Demetrius R Pretlow
(74) *Attorney, Agent, or Firm* — Harness, Dickey & Pierce, P.L.C.

(57) ABSTRACT

The present invention provides a method for detecting a positional change amount due to a movement of a moving body by reading, with a sensor, a plurality of gradations disposed along the direction of the movement. The method includes: a step for taking, as one period, one gradation among the plurality of gradations and acquiring a pseudo sinusoidal signal in response to the positional change amount; a step for executing a Fourier transform on the pseudo sinusoidal signal within the range of at least one gradation, and calculating, from the spectral intensity of each frequency component obtained by the Fourier transform, the signal intensity of a fundamental wave component and the signal intensity of at least one harmonic component; a step for calculating a gain corresponding to each of the at least one harmonic component by dividing each signal intensity of the at least one harmonic component by the
(Continued)

signal intensity of the fundamental wave component; and a step for detecting the positional change amount by subtracting, from the pseudo sinusoidal signal, each harmonic component multiplied by a corresponding gain.

14 Claims, 11 Drawing Sheets

(56) References Cited

U.S. PATENT DOCUMENTS

| | | | |
|---|---|---|---|
| 6,029,363 A | 2/2000 | Masreliez et al. | |
| 9,260,036 B2 | 2/2016 | Walters et al. | |
| 2006/0076480 A1* | 4/2006 | Kiriyama | G01D 18/001 250/231.16 |
| 2006/0077083 A1* | 4/2006 | Kiriyama | G01D 5/2448 341/120 |
| 2007/0102630 A1* | 5/2007 | Igaki | G01D 5/38 250/231.16 |
| 2010/0321008 A1* | 12/2010 | Mita | G01D 5/145 324/207.25 |
| 2011/0063622 A1* | 3/2011 | Igaki | G01D 5/24438 356/498 |
| 2012/0222465 A1* | 9/2012 | Lippuner | G01D 18/001 73/1.75 |
| 2014/0225598 A1 | 8/2014 | Romero et al. | |
| 2014/0300306 A1* | 10/2014 | Kato | G01D 5/12 318/490 |
| 2017/0317618 A1* | 11/2017 | Mizoguchi | G01D 5/3473 |

FOREIGN PATENT DOCUMENTS

| | | | | |
|---|---|---|---|---|
| EP | 1647811 A1 | * | 4/2006 | ........... G01D 5/2448 |
| EP | 2602594 A1 | | 6/2013 | |
| JP | 2002040067 A | * | 2/2002 | |
| JP | 2004108774 A | * | 4/2004 | |
| JP | 2006112862 A | | 4/2006 | |
| JP | 2008509414 A | * | 3/2008 | |
| JP | 2008304249 A | | 12/2008 | |
| JP | 2010156554 A | * | 7/2010 | |
| JP | 2010216961 A | * | 9/2010 | |
| JP | 2011075581 A | * | 4/2011 | |
| JP | 5041419 B2 | | 10/2012 | |
| JP | 2016166741 A | | 9/2016 | |
| JP | 2017142167 A | * | 8/2017 | |
| RU | 2413177 C1 | * | 2/2011 | |
| WO | WO-2010100407 A1 | * | 9/2010 | ............... G01D 5/36 |

OTHER PUBLICATIONS

Supplementary European Search Report issued in corresponding European Patent Application No. 19747666 dated Sep. 20, 2021 (8 pages).

Office Action dated Dec. 24, 2021 in corresponding Chinese patent application No. 201980010688.2 with English translation.

\* cited by examiner $X_p = X \cdot (M + \theta/2\pi)$

METHOD AND DEVICE FOR DETECTING POSITIONAL CHANGE AMOUNT DUE TO MOVEMENT OF MOVING BODY

CROSS REFERENCE TO RELATED APPLICATIONS

This application is a U.S. National Phase Application under 35 U.S.C. 371 of International Application No. PCT/JP2019/003623 filed on Feb. 1, 2019, which claims the benefit of priority from Japanese Patent Application No. 2018-017543 filed on Feb. 2, 2018. The entire disclosures of all of the above applications are incorporated herein by reference.

TECHNICAL FIELD

The present invention relates to a method, a device, and a program of detecting a positional change amount due to a rotational movement, a linear movement, or the like of a moving body.

BACKGROUND ART

A positional detecting device such as an encoder, a resolver, an inductosyn, or the like is used to detect a positional change amount due to a rotational movement, a linear movement, or the like of a moving body. This positional detecting device includes a graduation scale having a plurality of graduations disposed thereon, a sensor of reading the plurality of graduations, and a control unit of converting information read from the sensor into the positional change amount of the moving body. The moving body is equipped with either the graduation scale or the sensor. In order to read the positional change of the moving body with higher resolution, it is sufficient to narrow the interval of one graduation of the graduation scale. However, the graduations cannot be made infinitely fine since they are carved, for example, by processing. In order to measure the positional change amount of the moving body in more detail, there is a method of numerically calculating in the control unit an output signal based on the information read by the sensor so as to finely divide one graduation. The output signal of the sensor used in the positional detecting device is usually in the form of a rectangular wave or a sine wave, and one graduation has one cycle of 360°, and the output signal is often two-phase signals being 90° out of phase with each other. When the output signal of the sensor is sine wave signals, each of the two-phase signals has a shape of $\cos\theta$ or $\sin\theta$ with one graduation being one cycle. As a method of dividing one graduation, for example, a method of performing arctangent operation to the two-phase signals can be used (that is, $\theta=\tan^{-1}(\sin\theta/\cos\theta)$). With this method, a positional resolution can be improved according to a detecting resolution of the amplitude of the output signal of the sensor. However, since the output signal of the sensor includes distortions of harmonic components in addition to an ideal sine wave signal with one graduation being one cycle, not only the true positional change amount of the moving body but also the amount irrelevant to the actual positional change amount depending on the distortions of the harmonic components are included and measured. That is, when an error (a positional error) between an ideal position of the moving body with respect to a commanded moving amount and a measured position measured by the positional detecting device is calculated, the influence of the harmonic components appears as an error that is irrelevant to the actual positional change amount. In order to measure the true positional change amount and the positional error, it is necessary to remove the distortions of the harmonic components from the output signal of the sensor.

Due to such a problem, Patent Document 1 discloses a method of detecting and removing the distortions of third-order harmonic components included in two-phase sinusoidal signals being 90° out of phase with each other. Patent Document 2 discloses a method of detecting and removing the distortions of third-order and fifth-order harmonic components included in two-phase sinusoidal signals being 90° out of phase with each other.

CITATION LIST

Patent Literature

PATENT DOCUMENT 1: JP-A-2006-112862
PATENT DOCUMENT 2: JP-A-2008-304249

SUMMARY OF INVENTION

Technical Problem

In Patent Documents 1 and 2, a distortion of a specific harmonic component can be detected and removed. However, the output signal of the sensor includes various distortions of harmonic components depending on a graduation accuracy, a sensor characteristics and type, or the like. Thus, if only the distortion of the specific harmonic component can be detected, the distortions of the harmonic components cannot be uniformly removed for various sensors. For example, when the reading type of the sensor is optical or magnetic, their distortion characteristics are completely different, and even if the reading type of the sensor is magnetic, when a graduation to be read is formed on a magnetized ring or a gear, their distortion characteristics are completely different. Moreover, when a device such as an amplifier or the like of amplifying the output signal of the sensor is used, distortions of harmonic components due to this characteristic also occur. Therefore, even if the distortion of the harmonic component can be removed in one case, the distortion of the harmonic component cannot be removed in another case.

Therefore, an object of the present invention is to provide a method, a device, and a program capable of uniformly removing a distortion of a harmonic component even in various cases in order to detect a positional change amount due to a rotational movement, a linear movement, or the like of a moving body with high accuracy.

Solution to Problem

According to an aspect of the present invention, a method of detecting a positional change amount due to a movement of a moving body by reading, with a sensor, a plurality of gradations disposed along the direction of the movement, includes a) a step of acquiring from the sensor a pseudo sine wave signal depending to the positional change amount, wherein the pseudo sine wave signal is set such that the amount of one graduation of the plurality of graduations is one cycle, b) a step of performing Fourier transform to the pseudo sine wave signal in the range of at least one graduation, and from a spectrum intensity of each frequency component obtained by the Fourier transform, calculating a signal intensity of a fundamental wave component and a signal intensity of at least one harmonic component, c) a step of calculating a gain corresponding to each of the at least one harmonic component by dividing the signal intensity of each of the at least one harmonic component by the signal intensity of the fundamental component, and d) a step of detecting the positional change amount by subtracting from the pseudo sine wave signal each harmonic component multiplied by the corresponding gain.

According to a specific example of the present invention, in the above method, the step b) is a step of performing the Fourier transform, respectively, to the pseudo sine wave signal in the range of each one graduation, and calculating the signal intensity of the fundamental wave component and the signal intensity of the at least one harmonic component in the range of each one graduation, the step c) is a step of calculating the gain corresponding to each of the at least one harmonic component in the range of each one graduation, and the step d) is a step of detecting the positional change amount in the range of each one graduation by subtracting from the pseudo sine wave signal each harmonic component multiplied by the corresponding gain in the range of each one graduation.

According to a specific example of the present invention, in the above method, the step b) is a step of performing the Fourier transform to the pseudo sine wave signal in the range of at least one graduation predetermined, and calculating the signal intensity of the fundamental wave component and the signal intensity of the at least one harmonic component in the range of the at least one graduation predetermined, the step c) is a step of calculating the gain corresponding to each of the at least one harmonic component in the range of the at least one graduation predetermined, wherein each gain in the range of the at least one graduation predetermined is set as each gain in all of the range of the plurality of graduations, and the step d) is a step of detecting the positional change amount in all of the range of the plurality of gradations by subtracting from the pseudo sine wave signal each harmonic component multiplied by the corresponding gain in the range of the at least one graduation predetermined.

According to a specific example of the present invention, in the above method, the step d) includes d1) a step of setting, for each harmonic component, a plurality of provisional phase differences with respect to the fundamental wave component, being an ideal sine wave signal, which is set such that one of the plurality of graduations is the origin and the amount of one graduation is one cycle, d2) a step of calculating a provisional positional change amount by subtracting from the pseudo sine wave signal each harmonic component, including one of the plurality of provisional phase differences, multiplied by the corresponding gain, d3) a step of calculating an ideal positional change amount of the ideal sine wave signal, d4) a step of calculating a positional error by subtracting from the provisional positional change amount the ideal positional change amount, d5) a step of calculating a positional error amplitude in each provisional phase difference by extracting a maximum positional error that is the maximum and a minimum positional error that is the minimum among the positional errors and subtracting from the maximum positional error the minimum positional error, d6) a step of determining as a true phase difference a provisional phase difference having the smallest positional error amplitude among the respective positional error amplitudes calculated for the plurality of provisional phase differences, and d7) a step of detecting the positional change amount by subtracting from the pseudo sine wave signal each harmonic component, including the true phase difference, multiplied by the corresponding gain.

According to a specific example of the present invention, in the above method, the steps d2) to d7) are performed in the range of each one graduation of the plurality of graduations.

According to a specific example of the present invention, in the above method, the steps d2) to d6) are performed in the range of at least one graduation of the plurality of graduations, and the step d7) are performed with the true phase difference determined based on the steps d2) to d6) set as a true phase difference in all of the range of the plurality of graduations.

According to a specific example of the present invention, in the above method, the steps d2) to d7) are sequentially repeated from a harmonic component with a smaller order of the at least one harmonic component.

According to a specific example of the present invention, in the above method, the steps d2) to d7) are sequentially repeated from a harmonic component with a higher gain of the at least one harmonic component.

According to a specific example of the present invention, in the above method, the plurality of provisional phase differences are a group of phase differences that increase at arbitrary intervals in the range of the one cycle, According to a specific example of the present invention, in the above method, the pseudo sine wave signal includes two pseudo sine wave signals that are 90° out of phase with each other, and the step d) is a step of detecting the positional change amount by subtracting from each of the two pseudo sine wave signals each harmonic component multiplied by the corresponding gain and performing arctangent operation to one obtained by dividing one pseudo sine wave signal having a phase delayed by 90° of the two subtracted pseudo sine wave signals by the other pseudo sine wave signal.

According to a specific example of the present invention, in the above method, the step d) is a step of detecting the positional change amount by extracting a gain of a preset magnitude or more from the calculated gain and subtracting from the pseudo sine wave signal the harmonic component multiplied by the corresponding gain of the preset magnitude or more.

According to another aspect of the present invention, a positional detecting device includes a moving body, a graduation scale having a plurality of graduations disposed along the direction of a movement of the moving body, a sensor of outputting a pseudo sine wave signal depending to the positional change amount due to the movement of the moving body, wherein the pseudo sine wave signal is set such that the amount of one graduation of the plurality of graduations is one cycle, and a control unit connected to the sensor and including a signal processing unit and a storage unit. The signal processing unit is configured to perform Fourier transform to the pseudo sine wave signal in the range of at least one graduation, and from a spectrum intensity of each frequency component obtained by the Fourier transform, calculate a signal intensity of a fundamental wave component and a signal intensity of at least one harmonic component, to calculate a gain corresponding to each of the at least one harmonic component by dividing the signal intensity of each of the at least one harmonic component by the signal intensity of the fundamental component, and to detect the positional change amount by subtracting from the pseudo sine wave signal each harmonic component multiplied by the corresponding gain.

According to a specific example of the present invention, in the above positional detecting device, the signal processing unit is further configured to read, for each harmonic component, from the storage unit a plurality of provisional phase differences set with respect to the fundamental wave component, being an ideal sine wave signal, which is set such that one of the plurality of graduations is the origin and the amount of one graduation is one cycle, to calculate a provisional positional change amount by subtracting from the pseudo sine wave signal each harmonic component, including one of the plurality of provisional phase differences, multiplied by the corresponding gain, to read from the storage unit an ideal positional change amount of the ideal sine wave signal, to calculate a positional error by subtracting from the provisional positional change amount the ideal positional change amount, to calculate a positional error amplitude in each provisional phase difference by extracting a maximum positional error that is the maximum and a minimum positional error that is the minimum among the positional errors and subtracting from the maximum positional error the minimum positional error, to determine as a true phase difference a provisional phase difference having the smallest positional error amplitude among the respective positional error amplitudes calculated for the plurality of provisional phase differences, and to detect the positional change amount by subtracting from the pseudo sine wave signal each harmonic component, including the true phase difference, multiplied by the corresponding gain.

According to a specific example of the present invention, the above positional detecting device is an encoder, a resolver, or an inductosyn.

According to another aspect of the present invention, a signal processing unit acquires a pseudo sine wave signal outputted by a sensor of reading a plurality of graduations disposed along the direction of a movement of a moving body, the pseudo sine wave signal depending to a positional change amount due to the movement of the moving body, wherein the pseudo sine wave signal is set such that the amount of one graduation of the plurality of graduations is one cycle. A program causes the signal processing unit to execute a) a step of performing Fourier transform to the pseudo sine wave signal in the range of at least one graduation, and from a spectrum intensity of each frequency component obtained by the Fourier transform, calculating a signal intensity of a fundamental wave component and a signal intensity of at least one harmonic component, b) a step of calculating a gain corresponding to each of the at least one harmonic component by dividing the signal intensity of each of the at least one harmonic component by the signal intensity of the fundamental component, and c) a step of detecting the positional change amount by subtracting from the pseudo sine wave signal each harmonic component multiplied by the corresponding gain.

According to a specific example of the present invention, the above program causes the signal processing unit to execute in the step c), c1) a step of reading, for each harmonic component, a plurality of provisional phase differences set with respect to the fundamental wave component, being an ideal sine wave signal, which is set such that one of the plurality of graduations is the origin and the amount of one graduation is one cycle, c2) a step of calculating a provisional positional change amount by subtracting from the pseudo sine wave signal each harmonic component, including one of the plurality of provisional phase differences, multiplied by the corresponding gain, c3) a step of reading an ideal positional change amount of the ideal sine wave signal, c4) a step of calculating a positional error by subtracting from the provisional positional change amount the ideal positional change amount, c5) a step of calculating a positional error amplitude in each provisional phase difference by extracting a maximum positional error that is the maximum and a minimum positional error that is the minimum among the positional errors and subtracting from the maximum positional error the minimum positional error, c6) a step of determining as a true phase difference a provisional phase difference having the smallest positional error amplitude among the respective positional error amplitudes calculated for the plurality of provisional phase differences, and c7) a step of detecting the positional change amount by subtracting from the pseudo sine wave signal each harmonic component, including the true phase difference, multiplied by the corresponding gain.

Advantageous Effect of Invention

According to the present invention, the distortion of the harmonic component included in the sine wave signal output when the sensor detects one graduation of the graduation scale can be removed, and the positional change amount of the moving body can be detected with high accuracy.

Other objects, features and advantages of the present invention will become apparent from the following description of the embodiments of the present invention taken in conjunction with the accompanying drawings.

DESCRIPTION OF EMBODIMENTS

Embodiments according to the present invention will be described with reference to the drawings. However, the present invention is not limited to those embodiments.

Figure 1A:
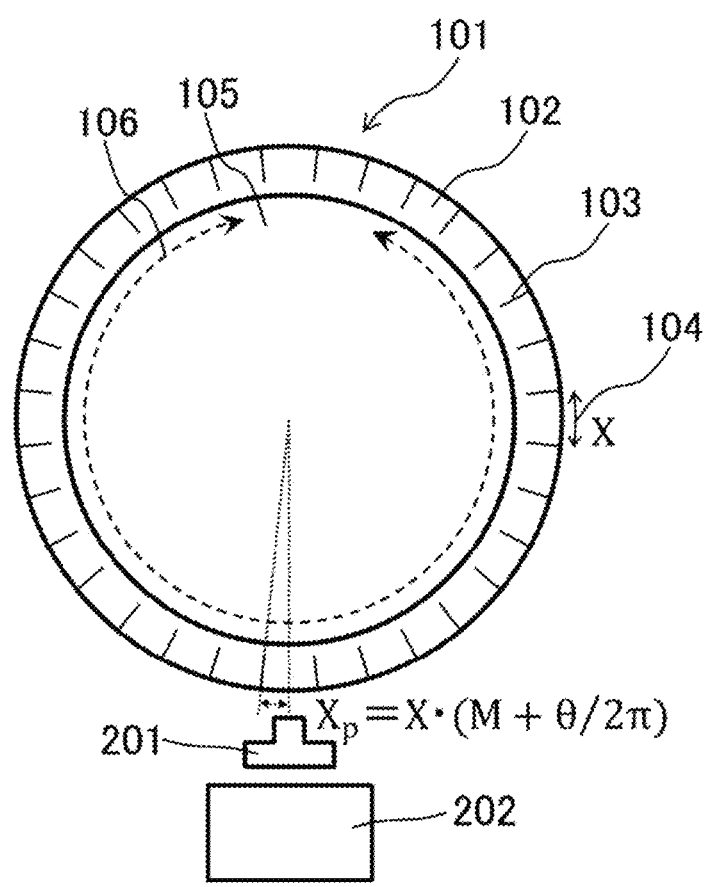
FIG. 1A is a schematic view showing a positional detecting device as an embodiment of the present invention, which is equipped with a graduation scale and detects a positional change amount of a moving body that performs a rotational movement.
Figure 1B:
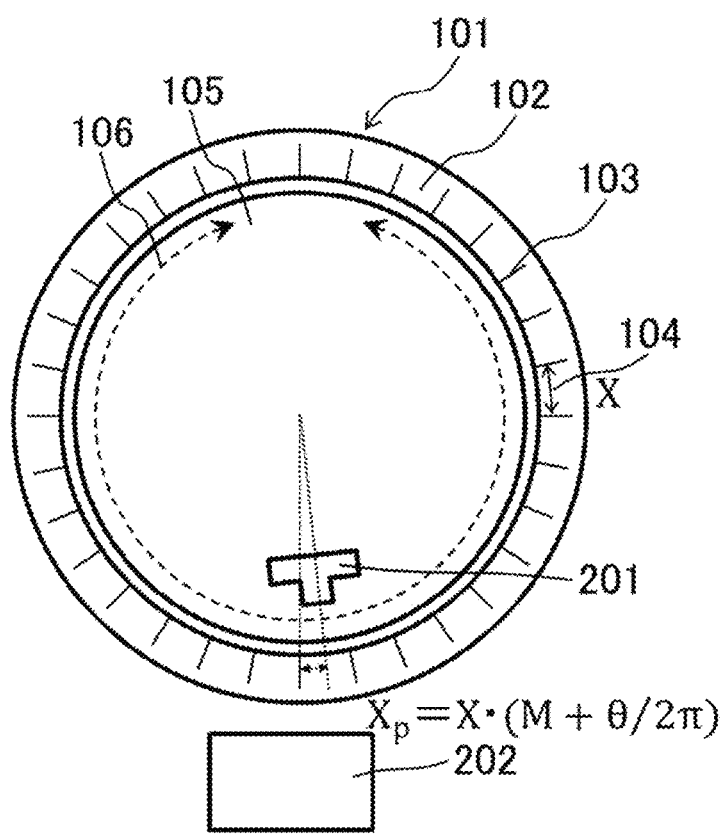
FIG. 1B is a schematic view showing a positional detecting device as another embodiment of the present invention, which is equipped with a sensor and detects a positional change amount of a moving body that performs a rotational movement.
Figure 2A:
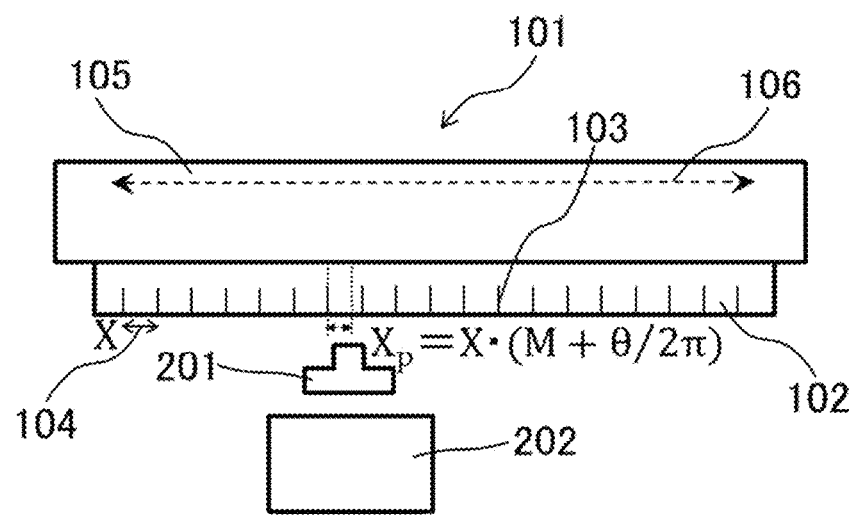
FIG. 2A is a schematic view showing a positional detecting device as another embodiment of the present invention, which is equipped with a graduation scale and detects a positional change amount of a moving body that perform a linear movement.
Figure 2B:
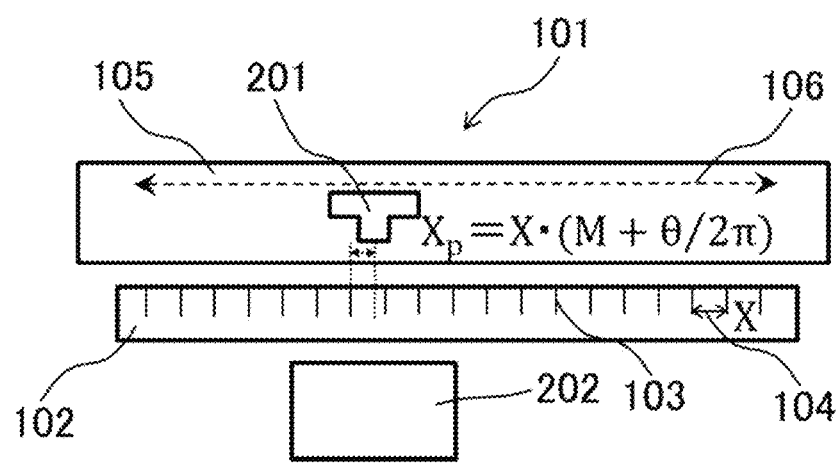
FIG. 2B is a schematic view showing a positional detecting device as another embodiment of the present invention, which is equipped with a sensor and detects a positional change amount of a moving body that perform a linear movement.
Figure 3:
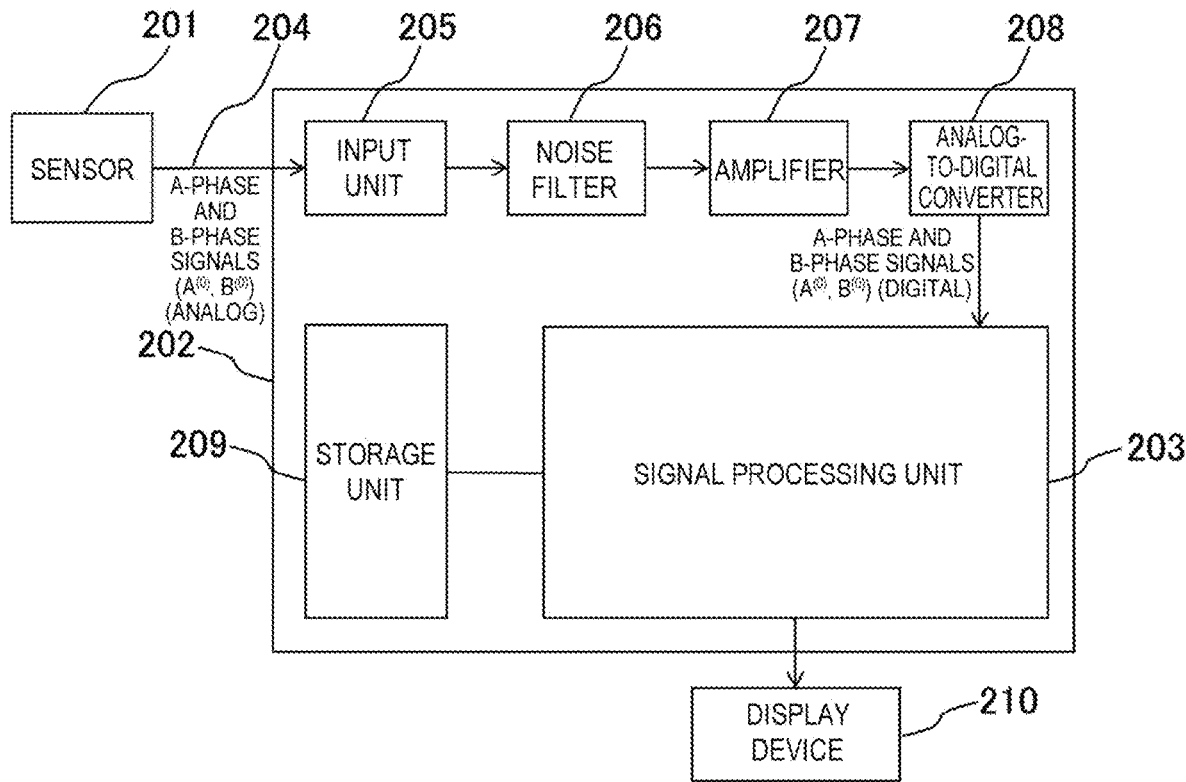
FIG. 3 is a schematic view of a control unit.

FIGS. 1A to 2B show the relations among a graduation scale 102 having a plurality of graduations 103, a moving body 105, a sensor 201, and a positional detecting device 101 that detects a positional change amount $X_p$ due to a movement of the moving body 105. The positional detecting device 101 detects the positional change amount $X_p$ due to the movement of the moving body 105 by using a plurality of graduations 103 disposed along the direction 106 of the movement. Herein, the graduation 103 is not limited to one that can be visually recognized as one actually carved on the graduation scale 102, for example, by processing, and may be one such that a predetermined positional interval on the graduation scale 102 can be read by the sensor 201 as an interval for one graduation. The graduation scale 102 is a member on which a plurality of such graduations 103 are disposed. Moreover, the size of an interval 104 of one graduation, which represents a distance between two adjacent graduations 103, is indicated by X, and X indicates an angle when the rotational movement is performed as in FIGS. 1A and 1B, and indicates a distance when the linear movement is performed as in FIGS. 2A and 2B. The positional detecting device 101 of FIG. 1A is a rotary positional detecting device of detecting the positional change amount $X_p$ of the moving body 105, that rotates along the direction 106 of the movement, which is equipped with the graduation scale 102. The positional detecting device 101 of FIG. 1B is a rotary positional detecting device of detecting the positional change amount $X_p$ of the moving body 105, that rotates along the direction 106 of the movement, which is equipped with the sensor 201. The positional detecting device 101 of FIG. 2A is a linear positional detecting device of detecting the positional change amount $X_p$ of the moving body 105, that moves linearly along the direction 106 of the movement, which is equipped with the graduation scale 102. The positional detecting device 101 of FIG. 2B is a linear positional detecting device of detecting the positional change amount $X_p$ of the moving body 105, that moves linearly along the direction 106 of the movement, which is equipped with the sensor 201. As shown in FIG. 3, the positional detecting device 101 includes the sensor 201 that reads a positional change with respect to the graduation 103 and the interval 104 of one graduation as pseudo sine wave signals, and a control unit 202 that is connected to the sensor 201 and converts a read information by the sensor 201 into the positional change amount $X_p$ of the moving body 105. In addition, typical examples of the positional detecting device 101 include an encoder, a resolver, an inductosyn, or the like. However, the principle thereof is not particularly limited as long as the present invention can be applied. Moreover, the sensor 201 is not particularly limited as long as the graduation 103 of the graduation scale 102 can be read. Examples of the sensor 201 include an optical sensor, a magnetic sensor, a coil, or the like. Moreover, the graduation scale 102 may be any graduation scale as long as the sensor 201 satisfies the conditions for reading the graduation 103, and a material, an arrangement method of the graduation 103, or the like of graduation scale 102 is not limited. The converted positional change amount $X_p$ may be output to a display device 210 or the like, or may be fed back to a motor to drive the moving body 105, a control device of the moving body 105, or the like.

Figure 4A:
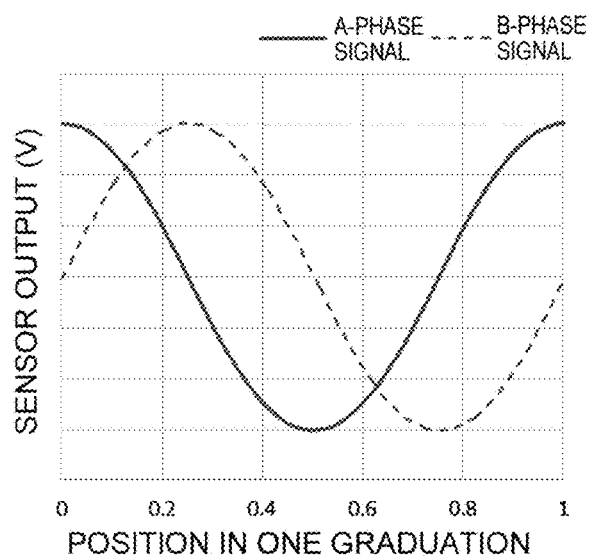
FIG. 4A shows pseudo sine wave signal outputs when the sensor detects one graduation.

Generally, when a relative movement with respect to the graduation scale 102 occurs, the sensor 201 can output the pseudo sine wave signals 204 whose amplitudes change in accordance with the positional change set such that one graduation of the plurality of graduations 103 is one cycle, based on the graduation 103 and the interval 104 of one graduation which are read. Moreover, the control unit 202 can convert the pseudo sine wave signals 204 output from the sensor 201 and the graduation detecting number M counted up to a certain time into the positional change amount $X_p$ of the moving body 105. As shown in FIGS. 1A to 2B, due to the relative movement between the graduation scale 102 and the sensor 201, as shown in FIG. 3, two pseudo sine wave signals 204 (A-phase signal ($A^{(0)}$) and B-phase signal ($B^{(0)}$) being 90° out of phase with each other as shown in FIG. 4A from the sensor 201 are output. The control unit 202 acquires the pseudo sine wave signals 204 measured by the sensor 201, and performs arctangent operation for each one graduation to one obtained by dividing one pseudo sine wave signal (B phase signal ($B^{(0)}$), having a phase delayed by 90°, of the two pseudo sine wave signals 204 by the other pseudo sine wave signal (A phase signal ($A^{(0)}$)) so as to calculate a provisional positional change amount $X_p^{(0)}$ of the moving body 105 as follows.

$$X_p^{(0)} = X \cdot \left( M + \frac{\theta^{(0)}}{2\pi} \right) = X \cdot \left( M + \tan^{-1}\left( \frac{B^{(0)}}{A^{(0)}} \right) \Big/ 2\pi \right) \quad \text{[MATH 1]}$$

Herein, $\theta^{(0)} = \tan^{-1}(B^{(0)}/A^{(0)})$ is numerically processed so as to fall within the range of 0 to $2\pi$. Moreover, the graduation detecting number M can be detected by processing such as increasing or decreasing the count value at the timing when $\theta^{(0)} = \tan^{-1}(B^{(0)}/A^{(0)})$ exceeds the boundary between 0 and $2\pi$, and the method thereof is not limited. When the graduation scale 102 and the sensor 201 perform the rotational movements as shown in FIGS. 1A and 1B, respectively, the control unit 202 can calculate the positional change amount $X_p$ of the moving body 105 as an angular displacement amount. When the graduation scale 102 and the sensor 201 perform the linear movements as shown in FIGS. 2A and 2B, respectively, the control unit 202 can calculate the positional change amount $X_p$ of the moving body 105 as a linear displacement amount.

Figure 4B:
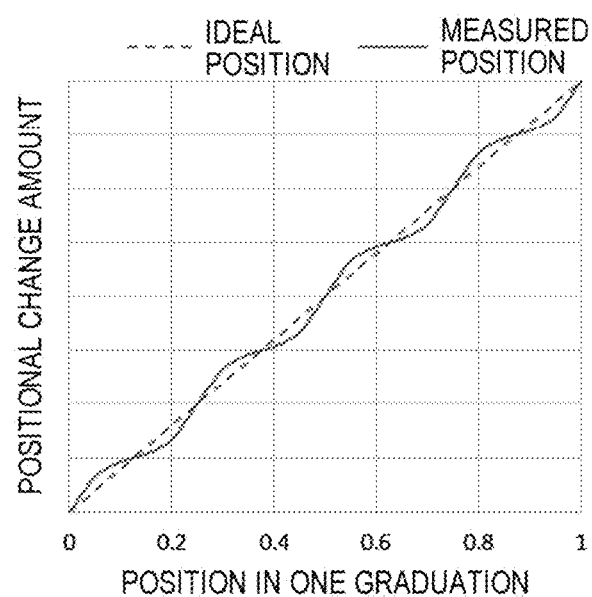
FIG. 4B shows a measured position and an ideal position with respect to a positional change of the moving body, which are calculated from the pseudo sine wave signals of FIG. 4A.
Figure 4C:
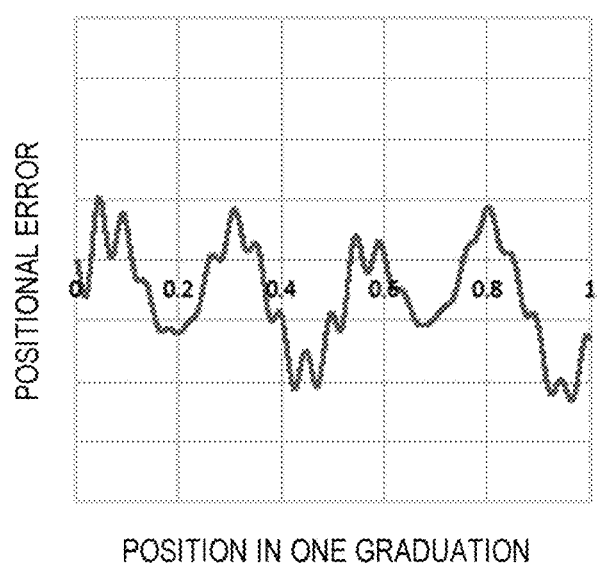
FIG. 4C shows a positional error between the measured position and the ideal position with respect to the positional change of the moving body, which are calculated from the pseudo sine wave signals of FIG. 4A.

However, an error occurs between this calculated provisional positional change amount $X_p^{(0)}$ and an ideal positional change amount $X_{pideal}$ of the moving body 105 that should be obtained by the positional detecting device 101 (ideally, $X_p=X_{pideal}$ is better). When the moving body 105 of FIGS. 1A and 1B performs the rotational movement at a constant speed, or the moving body 105 of FIGS. 2A and 2B performs the linear movement such that a movement command is issued to change the position of the moving body 105, if, as shown in FIG. 4B, it is assumed that the moving body 105 is ideally capable of performing the rotational movement or the linear movement without an error with respect to a command value, as the position of the moving body 105 increases due to the rotational movement or the linear movement of the moving body 105, the positional change amount $X_p$ calculated from the pseudo sine wave signals 204 measured by the sensor 201 linearly increases and there is no positional error between the position of the moving body 105 and the ideal positional change amount $X_{pideal}$. However, as shown in FIG. 4C, as the position of the moving body 105 actually increases, a positional error occurs between the positional change amount $X_p$ calculated from the pseudo sine wave signals 204 measured by the sensor 201 and the ideal positional change amount $X_{pideal}$. The positional error includes not only a true positional error of the moving mechanism of the moving body 105 but also an extra positional error by a distortion due to the characteristic of the sensor 201. The cause of this positional error by the sensor 201 is that the two pseudo sine wave signals 204 measured by the sensor 201 include harmonic components (components when the order k is an integer of 2 or more) as follows with respect to fundamental wave components $\cos(\theta)$ and $\sin(\theta)$, being ideal waves, set such that the amount of one graduation is one cycle, and this characteristics of the sensor 201 affects the positional change amount $X_p$ when the arctangent operation is performed as in the above [MATH 1].

$$A^{(0)} = \cos(\theta) + \sum_{k=2}^{\infty} a_k \cdot \cos(k \cdot \theta + \varphi a_k) \quad \text{[MATH 2]}$$

$$B^{(0)} = \sin(\theta) + \sum_{k=2}^{\infty} b_k \cdot \sin(k \cdot \theta + \varphi b_k) \quad \text{[MATH 3]}$$

Herein, $a_k$ and $b_k$ are gains of the harmonic components of the order k when the amplitudes of the first-order fundamental wave components set such that one graduation is one cycle is 1, and $\varphi a_k$ and $\varphi b_k$ are the phase differences between the harmonic components of order k and the fundamental components. In addition, generally, $a_k$, $b_k$, $\varphi a_k$, and $\varphi b_k$ do not change with different graduations 103, or have small differences even if they change.

Figure 5:
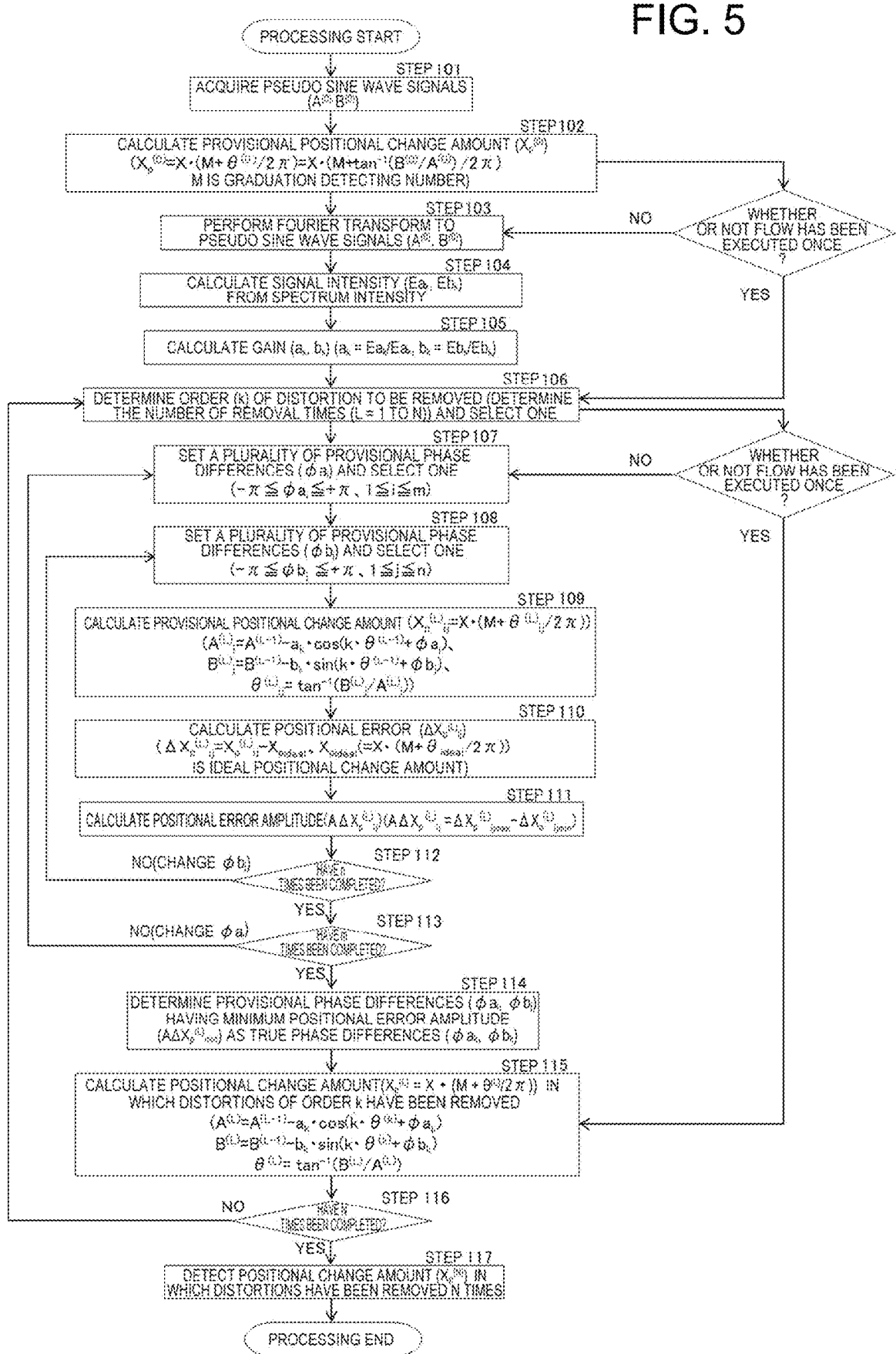
FIG. 5 is a flowchart as an embodiment of the present invention.

In order to remove the distortions of the harmonic components having the integer order k due to the sensor 201, the control unit 202 includes the signal processing unit 203 capable of executing a processing of a flowchart shown in FIG. 5. In addition, prior to the processing of the pseudo sine wave signals 204 by the signal processing unit 203, the control unit 202 may include an input unit 205 of acquiring the pseudo sine wave signals 204, a noise filter 206 of removing noise of the pseudo sine wave signals 204, an amplifier 207 of amplifying the pseudo sine wave signals 204, and an analog to digital converter 208 of converting the pseudo sine wave signals 204 from an analog value into a digital value. The pseudo sine wave signals 204 converted into the digital value are output to the signal processing unit 203. Moreover, the control unit 202 may include a storage unit 209 where data is written/read by the signal processing unit 203.

When the processing shown in the flowchart of FIG. 5 is executed, it is desirable that the moving body 105 be moving at a constant speed or moving with a small speed change. When the processing shown in the flowchart of FIG. 5 is started, the signal processing unit 203 acquires the pseudo sine wave signals 204 output by the sensor 201 in STEP 101. Next, in STEP 102, a temporary positional change amount $X_p^{(0)}$ of the moving body 105 is calculated based on the acquired pseudo sine wave signals 204. Then, in STEP 103, Fourier transform is performed to the acquired pseudo sine wave signals 204 so as to obtain a spectrum intensity of each order k. The Fourier transform may be performed to the pseudo sine wave signals 204 in the range of one graduation of the plurality of graduations 103, or may be performed to the pseudo sine wave signals 204 in the range of several graduations of the plurality of graduations 103. If the Fourier transform is performed to the pseudo sine wave signals 204 in the range of a small number of graduations, the spectrum intensity can be obtained at high speed, and if the Fourier transform is performed to the pseudo sine wave signals 204 in the range of a large number of graduations, the spectrum intensity can be obtained with high accuracy. Moreover, the Fourier transform may be performed to the pseudo sine wave signals 204 in the range of each of the plurality of graduations 103. In this case, gains $a_k$ and $b_k$ described below in the range of each one graduation are calculated, and the gains $a_k$ and $b_k$ in the range of each one graduation can be used so as to calculate a positional change amount $X_p^{(N)}$ described below according to the range of each one graduation. Moreover, when the waveforms of the pseudo sine wave signals 204 hardly change even if the graduations to be measured are different, the range of the graduations in which the Fourier transform is performed in advance from the plurality of graduations 103 may be determined, and the Fourier transform may be performed to the pseudo sine wave signals 204 in the determined range of at least one graduation predetermined. In this case, the gains $a_k$ and $b_k$ described below obtained by performing the Fourier transform in the range of the at least one graduation predetermined can be applied to all of the range of the plurality of graduations including the graduations not measured so as to calculate the positional change amount $X_p^{(N)}$ described below. The calculated gains $a_k$ and $b_k$ may be stored in the storage unit 209, and may be read from the storage unit 209 when the positional change amount $X_p^{(N)}$ is calculated. If the gains $a_k$ and $b_k$ in the range of the at least one graduation predetermined are applied, the storage capacity of the storage unit 209 can be reduced.

Figure 6:
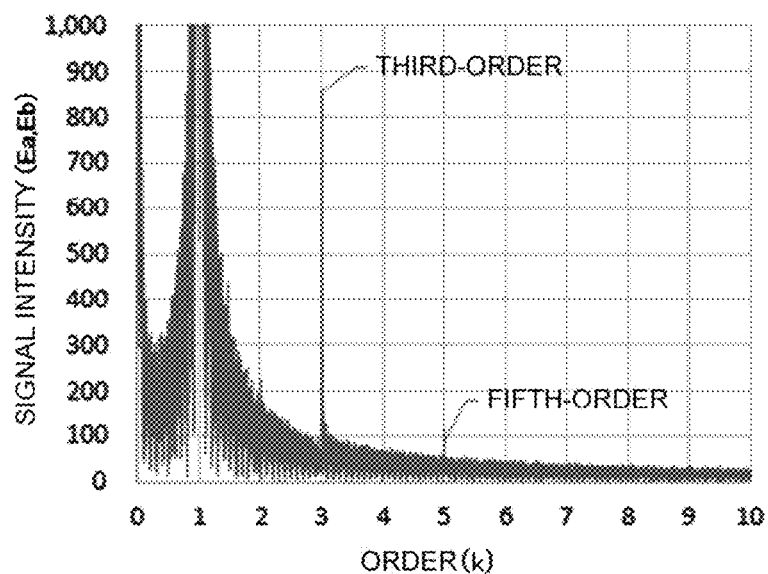
FIG. 6 shows a spectrum intensity obtained by performing Fourier transform to the pseudo sine wave signals of FIG. 4A.

In STEP 104, the signal intensities of the fundamental wave components and the signal intensities of the harmonic wave components are calculated by the spectrum intensity according to the Fourier transform performed in STEP 103. FIG. 6 shows an example of the spectrum intensity obtained by the Fourier transform of the pseudo sine wave signals 204. In addition to the fundamental wave component whose the order k is 1, the signal intensities are higher in the harmonic components whose the orders k are 3 and 5, and FIG. 6 shows that the pseudo sine wave signals 204 output by the sensor 201 include the third-order and fifth-order harmonic components.

In STEP 105, using this spectrum intensity, as shown in TABLE 1, by dividing the signal intensities $Ea_k$ and $Eb_k$ of the harmonic components of each order k included in the pseudo sine wave signals 204 by the signal intensities $Ea_1$ and $Eb_1$ of the fundamental wave components (of the order 1), respectively, the gains $a_k$ and $b_k$ corresponding to the harmonic components of each order k included in the pseudo sine wave signals 204 are calculated.

TABLE 1

| order k | A-phase | | B-phase | |
|---|---|---|---|---|
| 2 | $a_2$ | $Ea_2/Ea_1$ | $b_2$ | $Eb_2/Eb_1$ |
| 3 | $a_3$ | $Ea_3/Ea_1$ | $b_3$ | $Eb_3/Eb_1$ |
| 4 | $a_4$ | $Ea_4/Ea_1$ | $b_4$ | $Eb_4/Eb_1$ |
| ... | ... | | ... | |

When the Fourier transform is performed to the pseudo sine wave signals 204 in the range of each one graduation of the plurality of graduations 103, the gains of each graduation 103 are calculated. When the Fourier transform is performed to the pseudo sine wave signals 204 in the range of the at least one graduation of the plurality of graduations 103, the gains calculated in this range are made gains in all of the range of the plurality of graduations 103 including the graduations not measured. In addition, when two pseudo sine wave signals 204 being out of phase with each other are output as shown in FIG. 4A, since the signal intensities of the two pseudo sine wave signals 204 are approximately the same, the gain of the harmonic component obtained by performing the Fourier transform to only one of the two pseudo sine wave signals 204 may be applied to the gains of the harmonic components included in the two pseudo sine wave signals 204, and the average of the gains of the two harmonic components obtained by performing the Fourier transform to the two pseudo sine wave signals 204 may be applied to the gains of the harmonic components included in the two pseudo sine wave signals 204.

In STEP 106, the order k of the distortions of the harmonic components to be removed may be determined, and the number of removal times N, which is the number of the orders k, may be determined. For example, the distortions of the harmonic components having the gains $a_k$ and $b_k$ of a preset magnitude or more of the gains calculated in STEP 105 are determined as the order k of the distortions of the harmonic components to be removed. By determining the order k of the distortions of the harmonic components to be removed in this way, the distortions of the harmonic components can be removed from the pseudo sine wave signals 204 with high efficiency. For example, in the case of the spectrum intensity shown in FIG. 6, the pseudo sine wave signals 204 include the third-order and fifth-order harmonic components, and by dividing the third and fifth signal intensities $Ea_3$, $Eb_3$, $Ea_5$, and $Eb_5$ by the signal intensities $Ea_1$ and $Eb_1$ of the fundamental wave components, the gains $a_3$, $b_3$, $a_5$, and $b_5$ corresponding to the third-order and fifth-order harmonic components included in the pseudo sine wave signals 204 are calculated. Since the orders k of the distortions of the harmonic components to be removed are the third-order and the fifth-order, the number N of the orders k of the distortions of the harmonic components to be removed may be determined as 2.

Next, in STEPS 107 and 108, a plurality of provisional phase differences with respect to the fundamental wave components set such that the amount of one graduation of the plurality of graduations 103 is one cycle and one graduation of the plurality of graduations 103 is the origin are set for each harmonic component. The fundamental wave components correspond to ideal sine wave signals which do not include the harmonic components in the pseudo sine wave signals 204 output by the sensor 201. In the case of two pseudo sine wave signals 204 (A-phase signal ($A^{(O)}$) and B-phase signal ($B^{(O)}$)) being 90° out of phase with each other as shown in FIG. 4A, a plurality of provisional phase differences $\varphi a_i$ of each harmonic component of the A-phase signal may be set (the number is m), and a plurality of provisional phase differences $\varphi b_j$ of each harmonic component of the B-phase signal may be set (the number is n). In addition, m and n are arbitrary positive integers. The plurality of provisional phase differences $\varphi a_i$ and $\varphi b_j$ may be different in the order k of each harmonic component, or may be the same in the orders k of all of the harmonic components. Moreover, the plurality of provisional phase differences $\varphi a_i$ and $\varphi b_j$ may be a group of phase differences that increase at an arbitrary interval in the range of one cycle, that is, may be a group that the intervals of two adjacent provisional phase differences may be the same or may be a group that they are different. For example, since the range of one cycle of the pseudo sine wave signals (the fundamental wave components) is $2\pi$, if m=4 and n=4 and the intervals of two adjacent provisional phase differences are the same, for each of the four provisional phase differences $\varphi a_i$ and $\varphi b_j$, as shown in TABLE 2, 16 combination conditions of provisional phase differences are set such that the intervals between the two adjacent provisional phase differences are $\pi/2$. In STEP 107, any one of the four provisional phase differences $\varphi a_i$ is selected, and in STEP 108, any one of the four provisional phase differences $\varphi b_j$ is selected. That is, one of the 16 combination conditions of the provisional phase differences in TABLE 2 is set. In addition, in the following, the case where the pseudo sine wave signals 204 are the A phase signal ($A^{(O)}$) and the B phase signal ($B^{(O)}$) being 90° out of phase with each other will be described. However, it is readily understood that the case where the pseudo sinusoidal signal 204 is one signal and the case where the pseudo sinusoidal signals 204 are three signals are also similar to the case where the pseudo sinusoidal signals 204 are two signals.

TABLE 2

| No | $\varphi a_i$ | $\varphi b_j$ |
|---|---|---|
| 1 | $-\pi$ | $-\pi$ |
| 2 | | $-\pi/2$ |
| 3 | | 0 |
| 4 | | $\pi/2$ |
| 5 | $-\pi/2$ | $-\pi$ |
| 6 | | $-\pi/2$ |
| 7 | | 0 |
| 8 | | $\pi/2$ |
| 9 | 0 | $-\pi$ |
| 10 | | $-\pi/2$ |
| 11 | | 0 |
| 12 | | $\pi/2$ |
| 13 | $\pi/2$ | $-\pi$ |
| 14 | | $-\pi/2$ |
| 15 | | 0 |
| 16 | | $\pi/2$ |

In addition, while the processing of the flowchart shown in FIG. 5 is being executed, the plurality of provisional phase differences may be set for each harmonic component. Moreover, before the execution of the processing of the flowchart shown in FIG. 5 is started, the plurality of provisional phase differences may be preset for each harmonic component so as to store them in the storage unit 209, and when STEPS 107 and 108 are started, the plurality of provisional phase differences may be read from the storage unit 209.

In STEP 109, the provisional phase difference selected in STEPS 107 and 108 is used so as to calculate a positional change amount $X_p^{(L)}{}_{ij}$ (or $\theta^{(L)}{}_{ij}$) of the moving body 105 by subtracting each harmonic component multiplied by the corresponding gain as follows.

$$A_i^{(L)} = A^{(L-1)} - a_k \cdot \cos(k \cdot \theta^{(L-1)} + \phi a_i) \quad \text{[MATH 4]}$$

$$B_j^{(L)} = B^{(L-1)} - b_k \cdot \sin(k \cdot \theta^{(L-1)} + \phi b_j) \quad \text{[MATH 5]}$$

$$X_{p_{ij}}^{(L)} = X \cdot \left(M + \frac{\theta_{ij}^{(L)}}{2\pi}\right) = X \cdot \left(M + \tan^{-1}\left(\frac{B_j^{(L)}}{A_i^{(L)}}\right)\Big/2\pi\right) \quad \text{[MATH 6]}$$

Herein, L=1 to N. $A^{(L-1)}$ and $B^{(L-1)}$ are two pseudo sine wave signals 204 from which the distortions of the harmonic components up to one order before the order k currently to be calculated are removed, and $A^{(L)}$ and $B^{(L)}$ are two pseudo sine wave signals 204, including the provisional phase differences $\varphi a_i$ and $\varphi b_j$, from which the distortions of the harmonic components up to the order k currently to be calculated are removed. By using the two pseudo sine wave signals 204 from which the distortions of the harmonic components up to the order k are removed so as to perform the arctangent operation, the provisional positional change amount $X_p^{(L)}{}_{ij}$ (or $\theta^{(L)}{}_{ij}$) of the moving body 105 is calculated. For example, in the case where the distortions of the third-order and fifth-order harmonic components as in the spectrum intensity of FIG. 6 are removed, first, in order to remove the distortions of the third-order harmonic components, the provisional positional change amount $X_p^{(1)}{}_{ij}$ (or $\theta^{(1)}{}_{ij}$) is calculated as follows.

$$A_i^{(1)} = A^{(0)} - a_3 \cdot \cos(3 \cdot \theta^{(0)} + \phi a_i) \quad \text{[MATH 7]}$$

$$B_j^{(1)} = B^{(0)} - b_3 \cdot \sin(3 \cdot \theta^{(0)} + \phi b_j) \quad \text{[MATH 8]}$$

$$X_{p_{ij}}^{(1)} = X \cdot \left(M + \frac{\theta_{ij}^{(1)}}{2\pi}\right) = X \cdot \left(M + \tan^{-1}\left(\frac{B_j^{(1)}}{A_i^{(1)}}\right)\Big/2\pi\right) \quad \text{[MATH 9]}$$

Herein, $A^{(0)}$, $B^{(0)}$, and $\theta^{(0)}$ are those before distortion removal by the pseudo sine wave signals 204 measured by the sensor 201 as described above.

In STEP 110, first, the ideal positional change amount $X_{pideal}$ of the ideal sine wave signals is calculated. It is desirable that the calculated positional change amount $X_p$ ideally matches the ideal positional change amount $X_{pideal}$, or the error between them is minimized. In addition, the ideal positional change amount $X_{pideal}$ is calculated from $X \cdot (M+\theta_{ideal}/2\pi)$, and $\theta_{ideal}$ is a value when the A-phase signal and the B-phase signal are ideal sine wave signals. Next, the positional error $\Delta X_p^{(L)}{}_{ij}$ (or $\delta^{(L)}{}_{ij}$) is calculated by subtracting from the provisional positional change amount $X_p^{(L)}{}_{ij}$ (or $\theta^{(L)}{}_{ij}$) calculated in STEP 109 the ideal positional change amount $X_{pideal}$ (or $\theta_{ideal}$).

$$\Delta X_{p_{ij}}^{(L)}\left(=\frac{X}{2\pi}\delta_{ij}^{(L)}\right) = X_{p_{ij}}^{(L)} - X_{pideal}\left(=\frac{X}{2\pi}(\theta_{ij}^{(L)} - \theta_{ideal})\right) \quad \text{[MATH 10]}$$

In addition, the ideal positional change amount $X_{pideal}$ (or $\theta_{ideal}$) may be calculated each time the positional error $\Delta X_p^{(L)}{}_{ij}$ (or $\delta^{(L)}{}_{ij}$) is calculated. Moreover, before the execution of the processing of the flowchart shown in FIG. 5 is started, the ideal positional change amount $X_{pideal}$ (or $\theta_{ideal}$) may be preset so as to store it in the storage unit 209, and when STEP 110 is stated, the positional change amount $X_{pideal}$ (or $\theta_{ideal}$) may be read from the storage unit 209.

In STEP 111, by extracting a maximum positional error $\Delta X_p^{(L)}{}_{ijmax}$ (or $\delta^{(L)}{}_{ijmax}$) that is the maximum and a minimum positional error $\Delta X_p^{(L)}{}_{ijmin}$ (or $\delta^{(L)}{}_{ijmin}$) that is the minimum among the positional errors $\Delta X_p^{(L)}{}_{ijmax}$ (or $\delta^{(L)}{}_{ijmax}$) in one cycle and subtracting from the maximum positional error $\Delta X_p^{(L)}{}_{ijmax}$ (or $\delta^{(L)}{}_{ijmax}$) the minimum positional error $\Delta X_p^{(L)}{}_{ijmin}$ (or $\delta^{(L)}{}_{ijmin}$) as follows, the positional error amplitudes $A\Delta X_p^{(L)}{}_{ij}$ (or $A\delta^{(L)}{}_{ij}$) for the provisional phase differences $\varphi a_i$ and $\varphi b_j$ are calculated, respectively.

$$A\Delta X_{p_{ij}}^{(L)}\left(=\frac{X}{2\pi}A\delta_{ij}^{(L)}\right) = \Delta X_{p_{ijmax}}^{(L)} - \Delta X_{p_{ijmin}}^{(L)}\left(=\frac{X}{2\pi}(\delta_{ijmax}^{(L)} - \delta_{ijmin}^{(L)})\right) \quad \text{[MATH 11]}$$

Figure 7:
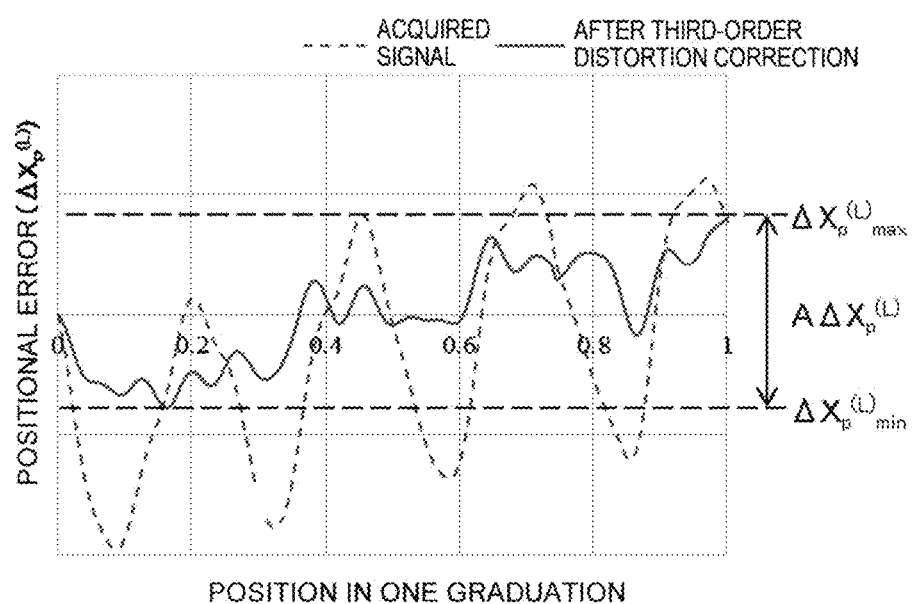
FIG. 7 shows the positional error with respect to the positional change amount of the moving body.

For example, as shown in FIG. 7, the positional errors $\Delta X_p^{(L)}$ (or $\delta^{(L)}$) with respect to the positional change amount $X_p$ are calculated for one of the plurality of provisional phase differences $\varphi a_i$ and $\varphi b_j$, and the maximum positional error $\Delta X_p^{(L)}{}_{ijmax}$ (or $\delta^{(L)}{}_{ijmax}$) and the minimum positional error $\Delta X_p^{(L)}{}_{ijmin}$ (or $\delta^{(L)}{}_{ijmin}$) are extracted from them so as to calculate the positional error amplitude $A\Delta X_p^{(L)}$ ($A\delta^{(L)}$) being a difference between them.

In STEP 112, it is determined whether or not the calculation of the positional error amplitudes $A\Delta X_p^{(L)}{}_{ij}$ (or $A\delta^{(L)}{}_{ij}$) for all of the n provisional phase differences $\varphi b_j$ of the B-phase signal is completed. If it is not completed, the provisional phase difference $\varphi b_j$ is changed after returning to STEP 108 so as to repeat STEPS 109 to 112. If the calculation of the positional error amplitudes $A\Delta X_p^{(L)}{}_{ij}$ (or $A\delta^{(L)}{}_{ij}$) for all of the n provisional phase differences $\varphi b_j$ is completed, in STEP 113, it is determined whether or not the calculation of the positional error amplitudes $A\Delta X_p^{(L)}{}_{ij}$ (or $A\delta^{(L)}{}_{ij}$) for all of the m provisional phase differences $\varphi a_j$ of the A-phase signal is completed. If it is not completed, the provisional phase difference $\varphi a_i$ is changed after returning to STEP 107 so as to repeat STEPS 108 to 113. For example, the positional error amplitudes $A\Delta X_p^{(L)}{}_{ij}$ (or $A\delta^{(L)}{}_{ij}$) are calculated for each of the 16 combination conditions of the provisional phase differences $\varphi a_i$ and $\varphi b_j$ set as shown in TABLE 2.

Figure 8:
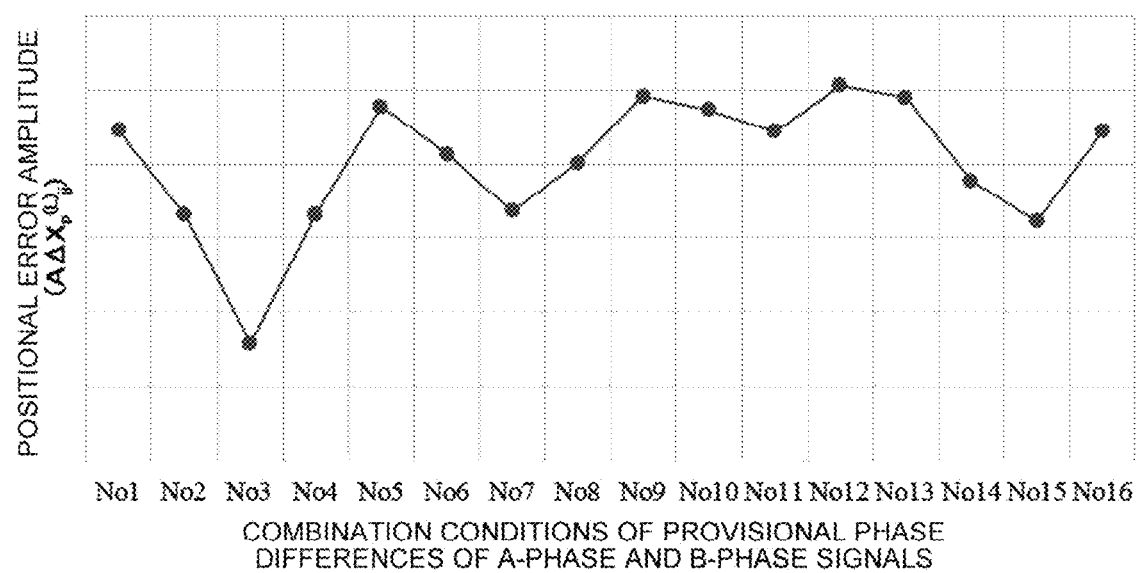
FIG. 8 shows the positional error amplitudes with respect to 16 conditions of the provisional phase differences.

In STEP 114, the provisional phase differences $\varphi a_i$ and $\varphi b_j$ having the smallest positional error amplitude $A\Delta X_p^{(L)}{}_{min}$ (or $A\delta^{(L)}{}_{min}$) of the respective positional error amplitudes $A\Delta X_p^{(L)}{}_{ij}$ (or $A\delta^{(L)}{}_{ij}$) calculated based on the plurality of provisional phase differences are determined as the true phase differences $\varphi a_k$ and $\varphi b_k$ due to the distortions of the corresponding harmonic components of the order k. For example, the positional error amplitudes $A\Delta X_p^{(L)}{}_{ij}$ (or $A\delta^{(L)}{}_{ij}$) corresponding to the 16 combination conditions of the provisional phase differences $\varphi a_i$ and $\varphi b_j$ of the A-phase signal and the B-phase signal in TABLE 2 are shown in FIG. 8. In the case of FIG. 8, since No. 3 has the smallest positional error amplitude $A\Delta X_p^{(L)}{}_{min}$, the provisional phase differences $\varphi a_i = -\pi$ and $\varphi b_j = 0$ are determined as the true phase differences $\varphi a_k$ and $\varphi b_k$ from TABLE 2.

In STEP 115, by using the gains $a_k$ and $b_k$ calculated in STEP 105 and the true phase differences $\varphi a_k$ and $\varphi b_k$ determined in STEP 114 so as to subtract the harmonic components of the order k, including the true phase differences $\varphi a_k$ and $\varphi b_k$, multiplied by the corresponding gains $a_k$ and $b_k$ as follows, the positional change amount $X_p^{(L)}$ (or $\theta^{(L)}$) in which the distortions of the harmonic components of the order k are removed is calculated.

$$A^{(L)} = A^{(L-1)} - a_k \cdot \cos(k \cdot \theta^{(L-1)} + \varphi a_k) \qquad [\text{MATH 12}]$$

$$B^{(L)} = B^{(L-1)} - b_k \cdot \sin(k \cdot \theta^{(L-1)} + \varphi b_k) \qquad [\text{MATH 13}]$$

$$X_p^{(L)} = X \cdot \left(M + \frac{\theta^{(L)}}{2\pi}\right) = X \cdot \left(M + \tan^{-1}\left(\frac{B^{(L)}}{A^{(L)}}\right) \middle/ 2\pi\right) \qquad [\text{MATH 14}]$$

$A^{(L)}$ and $B^{(L)}$ are the two pseudo sine wave signals 204 from which the distortions of the harmonic components up to the order k currently to be calculated, including the true phase differences $\varphi a_k$ and $\varphi b_k$, are removed. By performing the arctangent operation using the two pseudo sine wave signals 204 from which the distortions of the harmonic components up to the order k are removed, the positional change amount $X_p^{(L)}$ (or $\theta^{(L)}$) of the moving body 105 is calculated. For example, in the case of removing the particularly remarkable distortions of the third-order and fifth-order harmonic components with the spectral intensity of FIG. 6, first, in order to remove the distortions of the third-order harmonic components, the gains $a_3$ and $b_3$ calculated in STEP 105 and the true phase differences $\varphi a_3 = -\pi$ and $\varphi b_3 = 0$ determined in STEP 114 are used so as to calculate the positional change amount $X_p^{(1)}$ (or $\theta^{(1)}$) as follows.

$$A^{(1)} = A^{(0)} - a_3 \cdot \cos(3 \cdot \theta^{(0)} - \pi) \qquad [\text{MATH 15}]$$

$$B^{(1)} = B^{(0)} - b_3 \cdot \sin(3 \cdot \theta^{(0)} + 0) \qquad [\text{MATH 16}]$$

$$X_p^{(1)} = X \cdot \left(M + \frac{\theta^{(1)}}{2\pi}\right) = X \cdot \left(M + \tan^{-1}\left(\frac{B^{(1)}}{A^{(1)}}\right) \middle/ 2\pi\right) \qquad [\text{MATH 17}]$$

In STEP 116, it is determined whether or not the subtraction from the pseudo sine wave signals 204 for all of the orders k of the distortions of the harmonic components to be removed is completed. If it is not completed, by changing the order k of the distortions of the harmonic components to be removed after returning to STEP 106 so as to repeat STEP 107 to STEP 116, the positional change amount $X_p^{(L)}$ (or $\theta^{(L)}$) in which the distortions of the harmonic components up to the order k corresponding to the number of removal times L are removed is calculated.

$$A^{(L)} = A^{(L-1)} - a_k \cdot \cos(k \cdot \theta^{(L-1)} + \varphi a_k) = \qquad [\text{MATH 18}]$$
$$A^{(0)} - \sum_{P(k)=1}^{L} a_k \cdot \cos(k \cdot \theta^{(P-1)} + \varphi a_k)$$

$$B^{(L)} = B^{(L-1)} - b_k \cdot \sin(k \cdot \theta^{(L-1)} + \varphi b_k) = \qquad [\text{MATH 19}]$$
$$B^{(0)} - \sum_{P(k)=1}^{L} b_k \cdot \sin(k \cdot \theta^{(P-1)} + \varphi b_k)$$

$$X_p^{(L)} = X \cdot \left(M + \frac{\theta^{(L)}}{2\pi}\right) = X \cdot \left(M + \tan^{-1}\left(\frac{B^{(L)}}{A^{(L)}}\right) \middle/ 2\pi\right) \qquad [\text{MATH 20}]$$

For example, in the case of removing the particularly remarkable distortions of the third-order and fifth-order harmonic components with the spectral intensity of FIG. 6, in order to remove the distortions of the fifth-order harmonic components subsequently after removing the distortions of the third-order harmonic components as described above, the gains $a_5$ and $b_5$ calculated in STEP 105 and the true phase differences $\varphi a_5$ and $\varphi b_5$ determined in STEP 114 are used so as to calculate the positional change amount $X_p^{(2)}$ (or $\theta^{(2)}$) in which the distortions of the harmonic components up to the fifth-order (the orders being three and five) are removed as follows.

$$A^{(2)} = A^{(1)} - a_5 \cdot \cos(5 \cdot \theta^{(1)} + \varphi a_5) = \qquad [\text{MATH 21}]$$
$$A^{(0)} - a_3 \cdot \cos(3 \cdot \theta^{(0)} + \varphi a_3) - a_5 \cdot \cos(5 \cdot \theta^{(1)} + \varphi a_5)$$

$$B^{(2)} = B^{(1)} - b_5 \cdot \sin(5 \cdot \theta^{(1)} + \varphi b_5) = \qquad [\text{MATH 22}]$$
$$B^{(0)} - b_3 \cdot \sin(3 \cdot \theta^{(0)} + \varphi b_3) - b_5 \cdot \sin(5 \cdot \theta^{(1)} + \varphi b_5)$$

$$X_p^{(2)} = X \cdot \left(M + \frac{\theta^{(2)}}{2\pi}\right) = X \cdot \left(M + \tan^{-1}\left(\frac{B^{(2)}}{A^{(2)}}\right) \middle/ 2\pi\right) \qquad [\text{MATH 23}]$$

If the subtraction for all of the orders k of the distortions of the harmonic components to be removed is completed (if it is completed up to the number of removal times N determined in STEP 106 (L=N)), the respective harmonic components, including the true phase differences $\varphi a_k$ and $\varphi b_k$, multiplied by the corresponding gains $a_k$ and $b_k$ are subtracted from the pseudo-sinusoidal signals 204, whereby in STEP 117, the positional change amount $X_p^{(N)}$ in which all of the distortions of the harmonic components to be removed are removed is detected. For example, in the case of removing the particularly remarkable distortions of the third-order and fifth-order harmonic components with the spectral intensity of FIG. 6, the third-order harmonic components, including the true phase differences $\varphi a_3$ and $\varphi b_3$, multiplied by the corresponding gains $a_3$ and $b_3$ and the fifth-order harmonic components, including the true phase differences $\varphi a_5$ and $\varphi b_5$, multiplied by the corresponding gains $a_5$ and $b_5$ are subtracted from the two pseudo sine wave signals 204, whereby in STEP 117, the positional change amount $X_p^{(2)}$ in which the distortions of the third-order and fifth-order harmonic components to be removed are removed is detected.

STEPS 107 to 114 are arbitrary steps, and the phase differences of the respective harmonic components of the pseudo sine wave signals 204 may be preset and stored in the storage unit 209 before the execution of the processing of the flowchart shown in FIG. 5 is started. In STEP 115, these preset phase differences may be read from the storage unit 209 so as to be set as the true phase differences, and the positional change amount $X_p^{(N)}$ may be detected by subtracting from the pseudo sine wave signals 204 the respective harmonic components, including these preset phase differences, multiplied by the corresponding gains. Thereby, the positional change amount $X_p^{(N)}$ can be detected at high speed.

STEPS 106 to 115 may be performed with respect to the pseudo sine wave signals 204 in the range of each one graduation of the plurality of graduations 103. In the case, the true phase differences are determined in each graduation 103 so as to detect the positional change amount $X_p^{(N)}$ in which all of the distortions of the harmonic components to be removed are removed. Moreover, STEPS 106 to 114 may be performed with respect to the pseudo sine wave signals 204 in the range of at least one graduation predetermined of the plurality of graduations 103. In the case, the true phase differences in the range of the at least one graduation predetermined determined in STEPS 106 to 114 are determined as the true phase differences in all of the range of the plurality of graduations 103 including the range of the graduations unmeasured in STEP 115, and the positional change amount $X_p^{(L)}$ (or $\theta^{(L)}$) in which the distortions of the harmonic components are removed is calculated by subtracting the harmonic components, including the true phase differences, multiplied by the corresponding gains so as to detect the positional change amount $X_p^{(N)}$.

Moreover, for the orders k of the distortions of the harmonic components to be removed determined in STEP 106, STEPS 106 to 116 may be sequentially repeated from the harmonic components with the smaller order k of the harmonic components to be removed, and may be sequentially repeated from the harmonic components with the larger gain calculated in STEP 105 of the harmonic components to be removed.

In addition, the gains $a_k$ and $b_k$ and the true phase differences $\varphi a_k$ and $\varphi b_k$ of the respective harmonic components once calculated by executing the flowchart of FIG. 5 may be stored in the storage unit 209. If the gains $a_k$ and $b_k$ are stored in the storage unit 209, in the subsequent measurement of the positional change of the moving body 105, STEPS 103 to 105 may be omitted so as not to calculate the gains $a_k$ and $b_k$ again as in the flowchart of FIG. 5. Moreover, if the true phase differences $\varphi a_k$ and $\varphi b_k$ are stored in the storage unit 209, in the subsequent measurement of the positional change of the moving body 105, STEPS 107 to 114 may be omitted so as not to calculate the true phase differences $\varphi a_k$ and $\varphi b_k$ again as in the flowchart of FIG. 5. In other words, each time the sensor 201 detects the pseudo sine wave signals 204, the gains $a_k$ and $b_k$ and the true phase differences $\varphi a_k$ and $\varphi b_k$ are read from the storage unit 209, and the above-mentioned [MATH 18] to [MATH 20] can be repeatedly calculated up to the number of removal times N (achieve L=N) with respect to the A-phase signal ($A^{(O)}$) and the B-phase signal ($B^{(O)}$) being the pseudo sine wave signals 204 so as to detect the positional change amount Xp in which the harmonic components are removed. In addition, when performing the processing shown in the flowchart of FIG. 5, it is necessary that the moving body 105 is moving at a constant speed or is moving in a state in which the speed change is small. However, when the gains $a_k$ and $b_k$ and the true phase differences $\varphi a_k$ and $\varphi b_k$ of the respective harmonic components are read from the storage unit 209, it is not necessary that the moving body 105 is moving at a constant speed or is moving in a state in which the speed change is small.

Figure 9A:
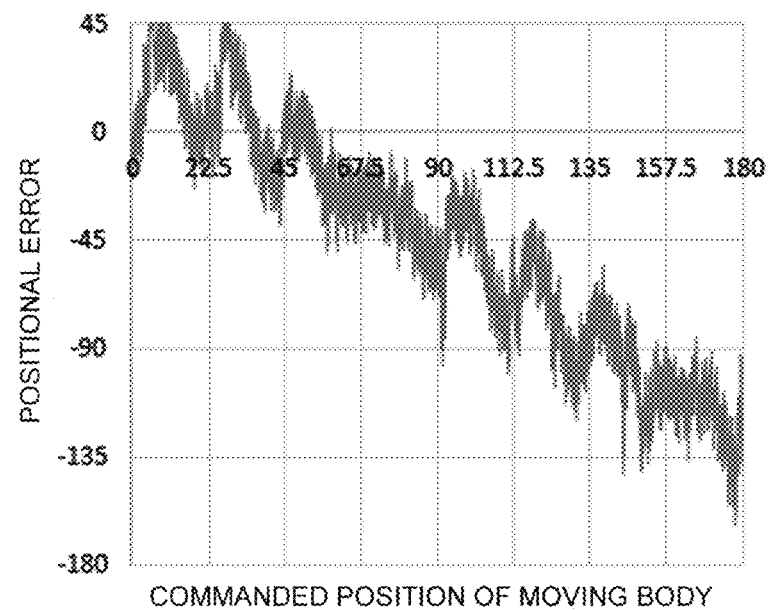
FIG. 9A shows the positional error with respect to a commanded position of the moving body before the distortions of the harmonic components are removed from the pseudo sine wave signals of FIG. 4A.
Figure 9B:
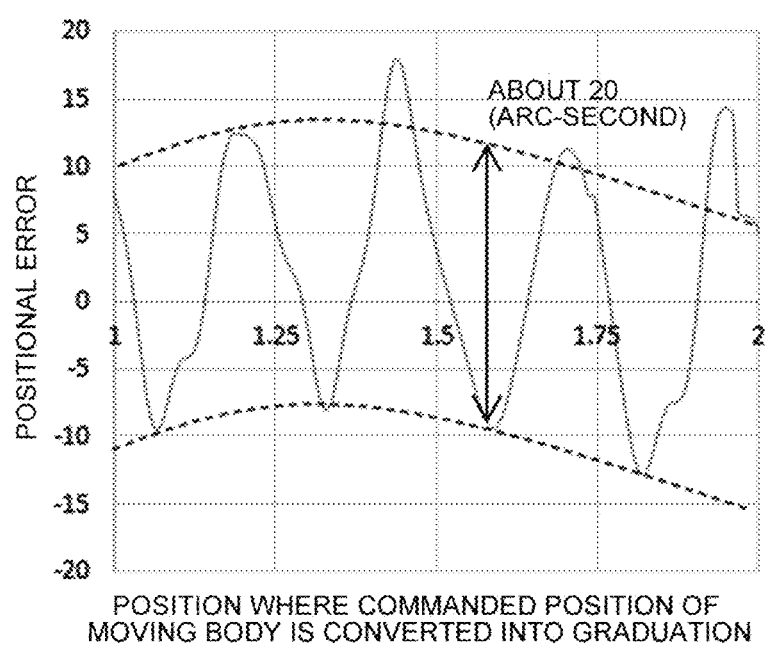
FIG. 9B is an enlarged view of a portion of FIG. 9A when the commanded position of the moving body is converted into the graduation.
Figure 9C:
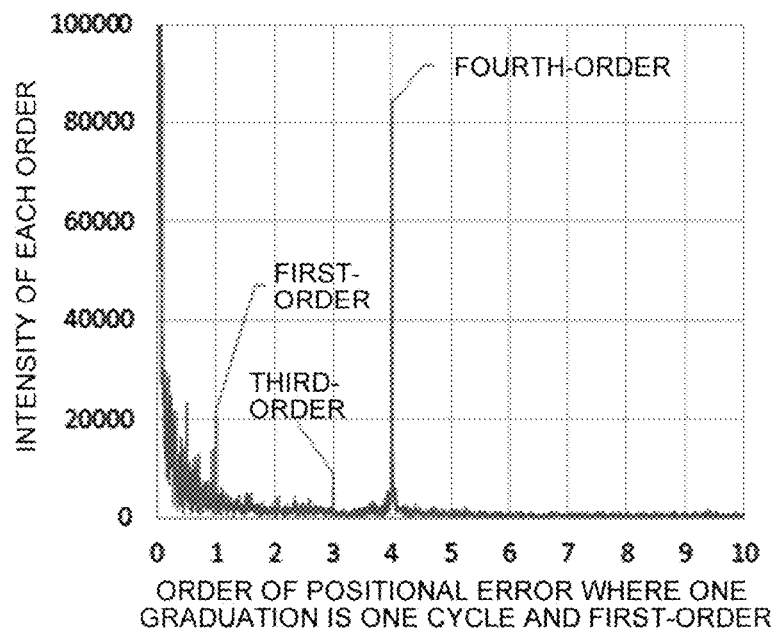
FIG. 9C shows a spectrum intensity obtained by performing Fourier transform to the positional error in which one graduation is one cycle and the first-order before the distortions of the harmonic components are removed from the pseudo sine wave signals of FIG. 4A.

FIGS. 9A to 9C show the positional error with respect to the command position of the moving body 105 before the distortions of the harmonic components are removed by the control unit 202, the positional error with respect to the command position in one graduation of the moving body 105 which is a partly enlarged view thereof, and the spectral intensity obtained by performing the Fourier transform to the positional error in which one graduation is one cycle and the first-order, respectively, based on the pseudo sine wave signals 204 output by the sensor 201 of the rotary positional detecting device of FIG. 1A. As shown in FIGS. 9A and 9B, the positional error occurs between the position measured by the two measured pseudo sine wave signals 204 and the commanded position of the moving body 105. According to FIG. 9B, the amplitude of the positional error is about 20 arc-second. Moreover, as shown in FIG. 9C, according to the spectrum intensity with respect to the positional error in which one graduation is one cycle and the first-order based on the two measured pseudo sine wave signals 204, the fourth-order of the orders of the harmonic components is particularly large.

Figure 10A:
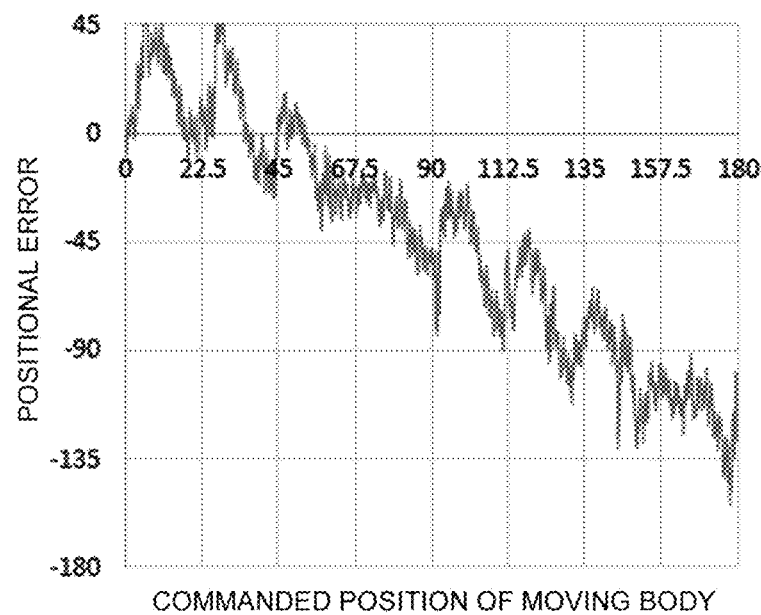
FIG. 10A shows the positional error with respect to the commanded position of the moving body after the distortions of the harmonic components are removed from the pseudo sine wave signals of FIG. 4A.
Figure 10B:
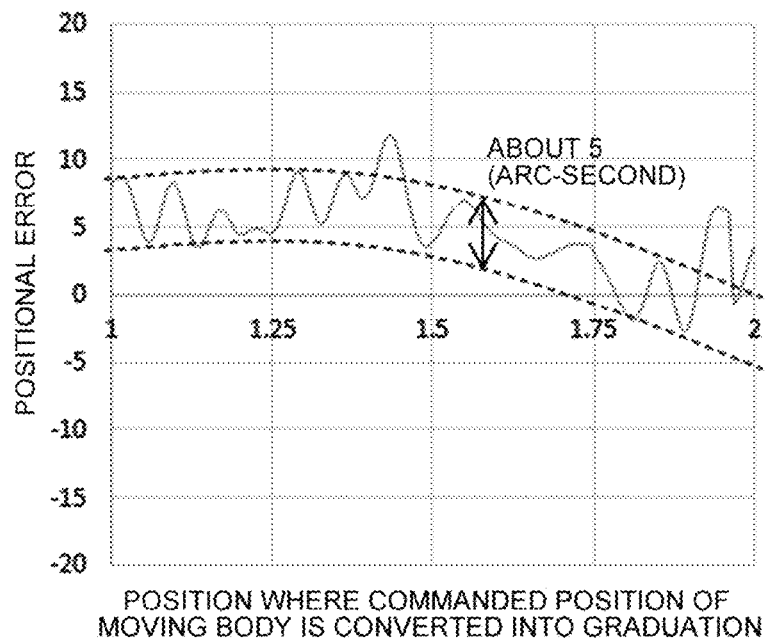
FIG. 10B is an enlarged view of a portion of FIG. 10A when the commanded position of the moving body is converted into the graduation.
Figure 10C:
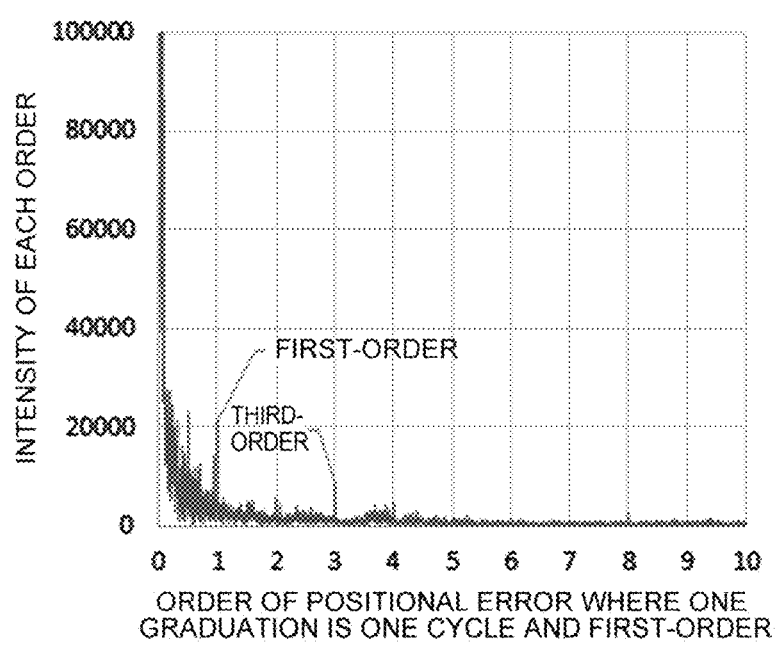
FIG. 10C shows a spectrum intensity obtained by performing Fourier transform to the positional error in which one graduation is one cycle and the first-order after the distortions of the harmonic components are removed from the pseudo sine wave signals of FIG. 4A.

Next, FIGS. 10A to 10C show the positional error with respect to the command position of the moving body 105 after the distortions of the harmonic components are removed by the control unit 202, the positional error with respect to the command position in one graduation of the moving body 105 which is a partly enlarged view thereof, and the spectral intensity obtained by performing the Fourier transform to the positional error in which one graduation is one cycle and the first-order, respectively, based on the pseudo sine wave signals 204 output by the sensor 201 of the rotary positional detecting device of FIG. 1A. By executing the processing of the flowchart of FIG. 5 in the signal processing unit 203, the distortions of the harmonic components are removed from the two measured pseudo sine wave signals 204. According to FIG. 10B, the amplitude of the positional error is about 5 arc-second, and the error after the distortion removal is reduced to about ¼ with respect to that before the distortion removal. Moreover, as shown in FIG. 10, by removing the distortions of the harmonic components from the two measured pseudo sine wave signals 204, the fourth harmonic component is significantly reduced. In this way, the control unit 202 can remove the distortions of the harmonic components by the sensor 201 included in the pseudo sine wave signals 204.

It should be further understood by those skilled in the art that although the foregoing description has been made on embodiments of the present invention, the present invention is not limited thereto and various changes and modifications may be made without departing from the principle of the present invention and the scope of the appended claims.

The invention claimed is:

1. A method of detecting a positional change amount due to a movement of a moving body by reading, with a sensor, a plurality of gradations disposed along the direction of the movement, the method comprising:
   a) a step of acquiring from the sensor a pseudo sine wave signal depending to the positional change amount, wherein the pseudo sine wave signal is set such that the amount of one graduation of the plurality of graduations is one cycle;
   b) a step of performing Fourier transform to the pseudo sine wave signal in the range of at least one graduation, and from a spectrum intensity of each frequency component obtained by the Fourier transform, calculating a signal intensity of a fundamental wave component and a signal intensity of at least one harmonic component;
   c) a step of calculating a gain corresponding to each of the at least one harmonic component by dividing the signal intensity of each of the at least one harmonic component by the signal intensity of the fundamental component; and
   d) a step of detecting the positional change amount by subtracting from the pseudo sine wave signal each harmonic component multiplied by the corresponding gain,
   wherein:
      the step b) is a step of performing the Fourier transform, respectively, to the pseudo sine wave signal in the range of each one graduation, and calculating the signal intensity of the fundamental wave component and the signal intensity of the at least one harmonic component in the range of each one graduation;

the step c) is a step of calculating the gain corresponding to each of the at least one harmonic component in the range of each one graduation; and the step d) is a step of detecting the positional change amount in the range of each one graduation by subtracting from the pseudo sine wave signal each harmonic component multiplied by the corresponding gain in the range of each one graduation;

or wherein:

the step b) is a step of performing the Fourier transform to the pseudo sine wave signal in the range of at least one graduation predetermined, and calculating the signal intensity of the fundamental wave component and the signal intensity of the at least one harmonic component in the range of the at least one graduation predetermined;

the step c) is a step of calculating the gain corresponding to each of the at least one harmonic component in the range of the at least one graduation predetermined, wherein each gain in the range of the at least one graduation predetermined is set as each gain in all of the range of the plurality of graduations; and the step d) is a step of detecting the positional change amount in all of the range of the plurality of graduations by subtracting from the pseudo sine wave signal each harmonic component multiplied by the corresponding gain in the range of the at least one graduation predetermined.

2. The method according to claim 1, wherein the step d) comprising:

d1) a step of setting, for each harmonic component, a plurality of provisional phase differences with respect to the fundamental wave component, being an ideal sine wave signal, which is set such that one of the plurality of graduations is the origin and the amount of one graduation is one cycle;

d2) a step of calculating a provisional positional change amount by subtracting from the pseudo sine wave signal each harmonic component, including one of the plurality of provisional phase differences, multiplied by the corresponding gain;

d3) a step of calculating an ideal positional change amount of the ideal sine wave signal;

d4) a step of calculating a positional error by subtracting from the provisional positional change amount the ideal positional change amount;

d5) a step of calculating a positional error amplitude in each provisional phase difference by extracting a maximum positional error that is the maximum and a minimum positional error that is the minimum among the positional errors and subtracting from the maximum positional error the minimum positional error;

d6) a step of determining as a true phase difference a provisional phase difference having the smallest positional error amplitude among the respective positional error amplitudes calculated for the plurality of provisional phase differences; and d7) a step of detecting the positional change amount by subtracting from the pseudo sine wave signal each harmonic component, including the true phase difference, multiplied by the corresponding gain.

3. The method according to claim 2, wherein the steps d2) to d7) are performed in the range of each one graduation of the plurality of graduations.

4. The method according to claim 2, wherein the steps d2) to d6) are performed in the range of at least one graduation of the plurality of graduations, and the step d7) are performed with the true phase difference determined based on the steps d2) to d6) set as a true phase difference in all of the range of the plurality of graduations.

5. The method according to claim 2, wherein the steps d2) to d7) are sequentially repeated from a harmonic component with a smaller order of the at least one harmonic component.

6. The method according to claim 2, wherein the steps d2) to d7) are sequentially repeated from a harmonic component with a higher gain of the at least one harmonic component.

7. The method according to claim 2, wherein the plurality of provisional phase differences are a group of phase differences that increase at arbitrary intervals in the range of the one cycle.

8. The method according to claim 1, wherein the pseudo sine wave signal includes two pseudo sine wave signals that are 90° out of phase with each other, and the step d) is a step of detecting the positional change amount by subtracting from each of the two pseudo sine wave signals each harmonic component multiplied by the corresponding gain and performing arctangent operation to one obtained by dividing one pseudo sine wave signal having a phase delayed by 90° of the two subtracted pseudo sine wave signals by the other pseudo sine wave signal.

9. The method according to claim 1, wherein the step d) is a step of detecting the positional change amount by extracting a gain of a preset magnitude or more from the calculated gain and subtracting from the pseudo sine wave signal the harmonic component multiplied by the corresponding gain of the preset magnitude or more.

10. A positional detecting device comprising a moving body, a graduation scale having a plurality of graduations disposed along the direction of a movement of the moving body, a sensor of outputting a pseudo sine wave signal depending to the positional change amount due to the movement of the moving body, wherein the pseudo sine wave signal is set such that the amount of one graduation of the plurality of graduations is one cycle, and a control unit connected to the sensor and comprising a signal processing unit and a storage unit; wherein the signal processing unit is configured to:

perform Fourier transform, respectively, to the pseudo sine wave signal in the range of each one graduation, and from a spectrum intensity of each frequency component obtained by the Fourier transform, calculate a signal intensity of a fundamental wave component and a signal intensity of at least one harmonic component in the range of each one graduation;

calculate a gain corresponding to each of the at least one harmonic component in the range of each one graduation by dividing the signal intensity of each of the at least one harmonic component by the signal intensity of the fundamental component; and detect the positional change amount in the range of each one graduation by subtracting from the pseudo sine wave signal each harmonic component multiplied by the corresponding gain in the range of each one graduation.

11. The positional detecting device according to claim 10, wherein the signal processing unit is further configured to:

read, for each harmonic component, from the storage unit a plurality of provisional phase differences set with respect to the fundamental wave component, being an ideal sine wave signal, which is set such that one of the plurality of graduations is the origin and the amount of one graduation is one cycle;

calculate a provisional positional change amount by subtracting from the pseudo sine wave signal each harmonic component, including one of the plurality of provisional phase differences, multiplied by the corresponding gain;

read from the storage unit an ideal positional change amount of the ideal sine wave signal;

calculate a positional error by subtracting from the provisional positional change amount the ideal positional change amount;

calculate a positional error amplitude in each provisional phase difference by extracting a maximum positional error that is the maximum and a minimum positional error that is the minimum among the positional errors and subtracting from the maximum positional error the minimum positional error;

determine as a true phase difference a provisional phase difference having the smallest positional error amplitude among the respective positional error amplitudes calculated for the plurality of provisional phase differences; and detect the positional change amount by subtracting from the pseudo sine wave signal each harmonic component, including the true phase difference, multiplied by the corresponding gain.

12. The positional detecting device according to claim 10, wherein the positional detecting device is an encoder, a resolver, or an inductosyn.

13. A positional detecting device comprising a moving body, a graduation scale having a plurality of graduations disposed along the direction of a movement of the moving body, a sensor of outputting a pseudo sine wave signal depending to the positional change amount due to the movement of the moving body, wherein the pseudo sine wave signal is set such that the amount of one graduation of the plurality of graduations is one cycle, and a control unit connected to the sensor and comprising a signal processing unit and a storage unit; wherein the signal processing unit is configured to:

perform Fourier transform to the pseudo sine wave signal in the range of at least one graduation predetermined, and from a spectrum intensity of each frequency component obtained by the Fourier transform, calculate a signal intensity of a fundamental wave component and a signal intensity of at least one harmonic component in the range of the at least one graduation predetermined;

calculate a gain corresponding to each of the at least one harmonic component in the range of the at least one graduation predetermined by dividing the signal intensity of each of the at least one harmonic component by the signal intensity of the fundamental component, wherein each gain in the range of the at least one graduation predetermined is set as each gain in all of the range of the plurality of graduations; and detect the positional change amount in all of the range of the plurality of graduations by subtracting from the pseudo sine wave signal each harmonic component multiplied by the corresponding gain in the range of the at least one graduation predetermined.

14. The positional detecting device according to claim 13, wherein the signal processing unit is further configured to:

read, for each harmonic component, from the storage unit a plurality of provisional phase differences set with respect to the fundamental wave component, being an ideal sine wave signal, which is set such that one of the plurality of graduations is the origin and the amount of one graduation is one cycle;

calculate a provisional positional change amount by subtracting from the pseudo sine wave signal each harmonic component, including one of the plurality of provisional phase differences, multiplied by the corresponding gain;

read from the storage unit an ideal positional change amount of the ideal sine wave signal;

calculate a positional error by subtracting from the provisional positional change amount the ideal positional change amount;

calculate a positional error amplitude in each provisional phase difference by extracting a maximum positional error that is the maximum and a minimum positional error that is the minimum among the positional errors and subtracting from the maximum positional error the minimum positional error;

determine as a true phase difference a provisional phase difference having the smallest positional error amplitude among the respective positional error amplitudes calculated for the plurality of provisional phase differences; and detect the positional change amount by subtracting from the pseudo sine wave signal each harmonic component, including the true phase difference, multiplied by the corresponding gain.

* * * * *